(12) United States Patent
Heiland

(10) Patent No.: US 7,525,314 B1
(45) Date of Patent: Apr. 28, 2009

(54) METHOD AND DEVICE FOR ACTIVE COMPENSATION OF MAGNETIC AND ELECTROMAGNETIC DISTURBANCE FIELDS

(76) Inventor: Peter Heiland, Karl-Liebknecht-Strassr 30, D-65479 Raunheim (DE)

( * ) Notice: Subject to any disclaimer, the term of this patent is extended or adjusted under 35 U.S.C. 154(b) by 0 days.

(21) Appl. No.: 09/423,180

(22) PCT Filed: Apr. 29, 1998

(86) PCT No.: PCT/DE98/01177

§ 371 (c)(1),
(2), (4) Date: Nov. 2, 1999

(87) PCT Pub. No.: WO98/50798

PCT Pub. Date: Nov. 12, 1998

(30) Foreign Application Priority Data

May 2, 1997 (DE) .................................. 197 18 649

(51) Int. Cl.
*G01V 3/00* (2006.01)
(52) U.S. Cl. ....................... 324/320; 324/318
(58) Field of Classification Search ......... 324/300–322; 600/407–422
See application file for complete search history.

(56) References Cited

U.S. PATENT DOCUMENTS

| 3,801,877 A | 4/1974 | Griese et al. |
| 5,586,064 A | 12/1996 | Grupp |

FOREIGN PATENT DOCUMENTS

| DE | 42 17 302 A1 | 5/1992 |
| EP | 0 514 027 A2 | 4/1992 |

*Primary Examiner*—Brij B Shrivastav

(57) ABSTRACT

A first sensor of the device for compensating magnetic and/or electromagnetic disturbance fields in a predetermined volume range is provided beyond the predetermined volume range for producing a signal that is determined by the magnetic and/or electromagnetic field at the location of the sensor. A second sensor is provided within the predetermined volume range for producing a signal which is determined by the magnetic and/or electromagnetic field at the location of the sensor. The signals from the first and second sensors are used as an input signal for directing a regulator amplifier belonging to a Helmholtz coil. After executing an empirically determined transmission function, the signal from the second sensor is applied to the regulator input of the digital regulator amplifier and the output signal of the digital regulator amplifier controls the current through the Helmholtz coil such that the magnetic and/or electromagnetic field in the predetermined volume range is at least partially compensated.

19 Claims, 3 Drawing Sheets

Figure 1:
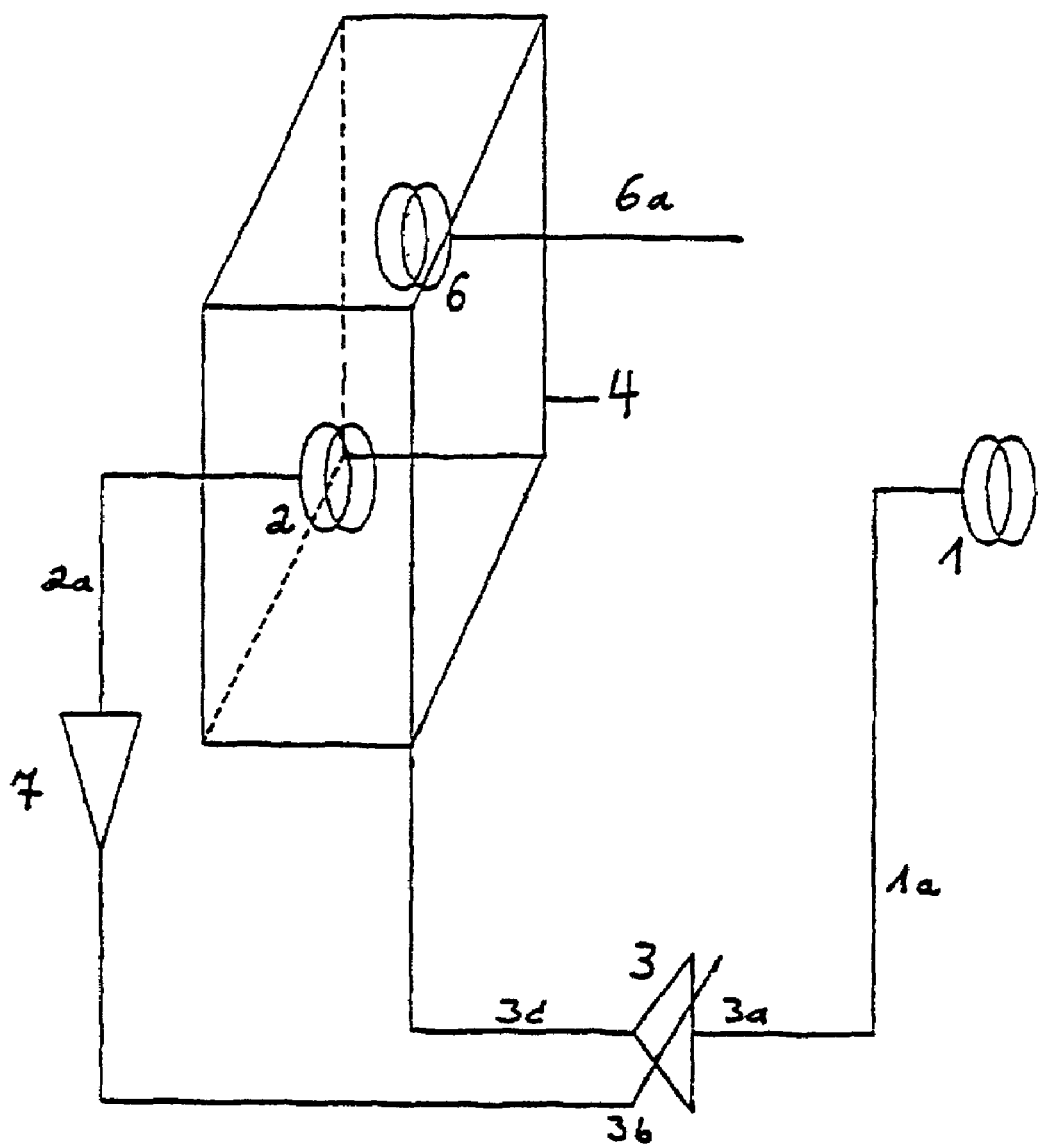

METHOD AND DEVICE FOR ACTIVE COMPENSATION OF MAGNETIC AND ELECTROMAGNETIC DISTURBANCE FIELDS

The invention relates to an apparatus and a method for active compensation for magnetic and, preferably also, electromagnetic interference fields in a predetermined volume area.

Present-day measurement technology allows the detection of electromagnetic radiation and of magnetic fields with extremely small amplitudes. Thus, for example in medical technology, nuclear magnetic resonance (NMR) and, in particular, magnetic resonance imaging (MRI) can be used to detect amplitudes in the range below 10 $nT/\sqrt{Hz}$. SQUID sensors (SQUID: Superconducting QUantum Interference Device) can even detect signal levels down to the range of about 100 $fT/\sqrt{Hz}$.

Such small wanted signal field amplitudes are, however, close to or in some cases less than the general electromagnetic and magnetic interference fields at the moment.

Such interference fields can be caused, for example, by moving metal masses, such as elevators, railroads and motor vehicles. The frequency of such interference fields is in the range from zero to about 10 Hertz. Furthermore, asymmetrically loaded electrical power supply devices can produce interferences in the region of 50 Hertz, and harmonics of this frequency. The described interference fields cause so-called "ghost images" in MRI measurements and result in resonance shifts in NMR measurements.

A conventional apparatus for active compensation for electromagnetic and, in particular, magnetic interference fields in a predetermined volume area is used, for example, both for MRI equipment and for electron beam equipment for lithography and microscopy. For example, the electrons emitted from the cathode of an electron scanning microscope while scanning the sample are deflected in a predetermined manner by electromagnetic fields which are caused, for example, by coils. The magnetic and electromagnetic interference fields which are also present in the microscope influence the path of the electrons to the sample in such a manner that the impact point can be indicated only with a certain amount of blurring. For this reason, coils are fitted to the walls of the room in which the electron microscope is located. The magnetic interference field in the room is measured using a flux-gate sensor, and the electrical signal obtained in this way is used, by means of digital signal processing with negative feedback, to actuate the coils which are located on the walls.

A system produced in this way for active compensation for magnetic and electromagnetic interference fields has the disadvantage that, although it may be possible to compensate for the interference fields exactly, this statement is, however, completely true only at the location of the sensor. Such a method thus always has a systematic error.

However, it is impossible to arrange the sensor, whose signal is used for negative feedback, close to the electron paths in the microscope, since this negative feedback then also compensates for the electromagnetic field used for defined deflection of the electrons.

In a similar manner, the aim of such active compensation for interference fields in MRI systems is to reduce the environmental interference fields in three mutually perpendicular axes. As a rule, the interference levels in this case vary from 0.1 $\mu T/\sqrt{Hz}$ to 10 $\mu T/\sqrt{Hz}$ and must be reduced down to about 10 $nT/\sqrt{Hz}$. Even in this case, the sensor for controlling the negative feedback cannot be arranged in the measurement room since, otherwise, the measurement signal is at least corrupted by the magnetic field compensation.

Thus, in parallel with the increase in the measurement sensitivity, the requirement grew to suppress existing electromagnetic interference fields in order to improve the measurement resolution further, to fully utilize the potential of present-day sensors, and to, allow electrically charged particles to be controlled more accurately by using defined electromagnetic fields. Furthermore, the provision of environmental conditions with magnetic and electromagnetic noise levels which are very much smaller than the expected signal level is a threshold for successful commercial utilization of such technologies.

EP 0 514 027 A2 discloses an apparatus for reducing magnetic interference, which has a SQUID sensor and a coil pair which cancels out the magnetic interference, with the sensor signal being fed back to the coils. This apparatus has the disadvantage already mentioned above, that interference fields are compensated for completely only at the location of the sensor.

The object of the invention is thus to compensate for electromagnetic and, in particular, magnetic interference fields at the actual "point of origin", without significantly influencing the wanted signal that is present.

This object is achieved surprisingly simply by an apparatus as claimed in claim 1, and by a method as claimed in claim 12.

In this case, an apparatus for active compensation for magnetic and/or electromagnetic interference fields in a predetermined volume area is provided by means of at least one Helmholtz coil, which essentially encloses the predetermined volume area, and a device for actuating the Helmholtz coil as a function of sensor signals, in which at least one first sensor is arranged inside the predetermined volume area in order to produce a signal which depends on the magnetic and/or electromagnetic field at the location of the sensor. Furthermore, at least one second sensor is arranged outside the predetermined volume area, in order to produce a signal which depends on the magnetic and/or electromagnetic field at the location of the sensor. The signal from the first sensor and from the second sensor is used as the input signal for actuating a regulator amplifier associated with the Helmholtz coil. For example, once it has passed through a transfer function which is generally determined empirically, the signal from the first sensor is applied to the regulator input of the digitally designed regulator amplifier, and the output signal from the digital regulator amplifier controls the current through the Helmholtz coil in such a manner that the magnetic and/or electromagnetic interference field in the predetermined volume area is at least partially compensated for.

The pre-processed electrical signal from the second sensor outside the predetermined volume is advantageously amplified and is fed forward or fed backward into the coils, depending on the arrangement of the second sensor with respect to the Helmholtz coil, while the electrical signal from the first sensor inside the predetermined volume indicates, as an interference signal, the "quality" of the interference field compensation, and is used adaptively in order to set the parameters for feeding forward.

In this way, the interference field can advantageously be compensated for, specifically, at the actually relevant location, for example on the electron paths in an electron microscope.

The apparatus can also be used for active compensation for magnetic and/or electromagnetic interference fields in a predetermined volume region in three dimensions, if the apparatus is equipped with a large number of sensors for detecting magnetic and/or electromagnetic fields in all three spatial directions, and their electrical signals are used to actuate the digital regulator amplifier, and the output signals from the digital regulator amplifier unit are used to control the current through the coils of a three-axis Helmholtz cage, in such a manner that the electromagnetic interference fields in all three spatial directions inside the predetermined volume are essentially compensated for.

If the predetermined volume area essentially comprises the entire volume inside the Helmholtz cage, that is to say if the second sensor is located outside the Helmholtz cage, then the pre-processed electrical signal from the second sensor is advantageously amplified and is fed forward to the coils, with the electrical signal from the first sensor indicating the quality of the interference field compensation, and being used to set the parameters for feeding forward.

If, on the other hand, the predetermined volume area encloses only a limited volume section inside the Helmholtz cage, and if the second sensor is also arranged inside the Helmholtz cage, then the pre-processed electrical signal from the second sensor is advantageously amplified and is fed to the coils with negative feedback, with the electrical signal from the first sensor once again indicating the quality of the interference field compensation and being used to set the feedback parameters. Such an arrangement may be used, for example, to set the feedback parameters in a conventional compensation device with negative feedback. The process of setting the feedback parameters for the negative feedback, which is normally tedious and can be carried out only manually by a person skilled in the art, in conventional systems for interference field compensation can thus be carried out automatically, instead.

Depending on the application and depending on the requirement, the principle of the invention can be carried out with a large number of field sensors inside and outside the predetermined volume, such as coils, flux-gate sensors, ESR sensors, NMR sensors, SQUID sensors and Hall-effect sensors. Different sensors can advantageously also be used at the same time, for example a flux-gate sensor outside the predetermined volume and a SQUID sensor in the Helmholtz cage, or a plurality of different sensors (as second sensors) and/or inside (as first sensors) the cage. This high flexibility ensures that the method according to the invention can always be optimally adapted to the respective electromagnetic interference fields and wanted fields.

Owing to this high adaptation capability of the method, the apparatus according to the invention can be used for active magnetic and/or electromagnetic shielding for many measurements or procedures in which magnetic and/or electromagnetic fields play a role as wanted fields which, for example, are detected as a wanted signal or are used to control electrical particles.

According to the invention, the first sensor or sensors can advantageously at least partially be replaced and thus saved by using one or more third sensors which are present in the predetermined volume in order to detect a wanted signal, for example NMR sensors in an NMR system or a SQUID sensor in a SQUID system, at the same time as a first sensor or sensors for detecting the interference signal. In a further refinement of the invention, the apparatus may comprise a magnetically shielded room (MSR). In this case, the Helmholtz coils are fitted externally to the magnetically shielded room, and at least one second sensor is arranged outside the predetermined volume area, and at least one first sensor is arranged inside the magnetically shielded room in the predetermined volume area. The invention can advantageously easily be coupled to passive magnetic shielding methods such as a magnetically shielded room (MSR), as has already been mentioned, in order to obtain previously unachieved suppression of the magnetic and/or electromagnetic interference fields. In this way, it has been possible to increase the attenuation in an MSR with active compensation according to the invention by 35 dB at 0.1 Hz, in comparison with the attenuation in an MSR without active suppression. In fact, in the frequency band with a mid-frequency from 0.1 to 0.2 Hz, in which the interference field suppression of a conventional MSR is less than that of other frequency bands by virtue of the design, the additional active compensation according to the invention for magnetic and/or electromagnetic interference offers a major improvement over apparatuses according to the prior art.

In certain circumstances, the use of the interference field suppression according to the invention even makes it possible to save entirely the need to use a magnetically shielded room, or to achieve this using simpler means.

The apparatus according to the invention can also advantageously be used to shield a large number of systems in which magnetic and/or electromagnetic interference fields may play a role, for example NMR systems, MRI systems, ESR systems, in electron beam systems and accelerator systems (for example linear accelerators).

Figure 2:
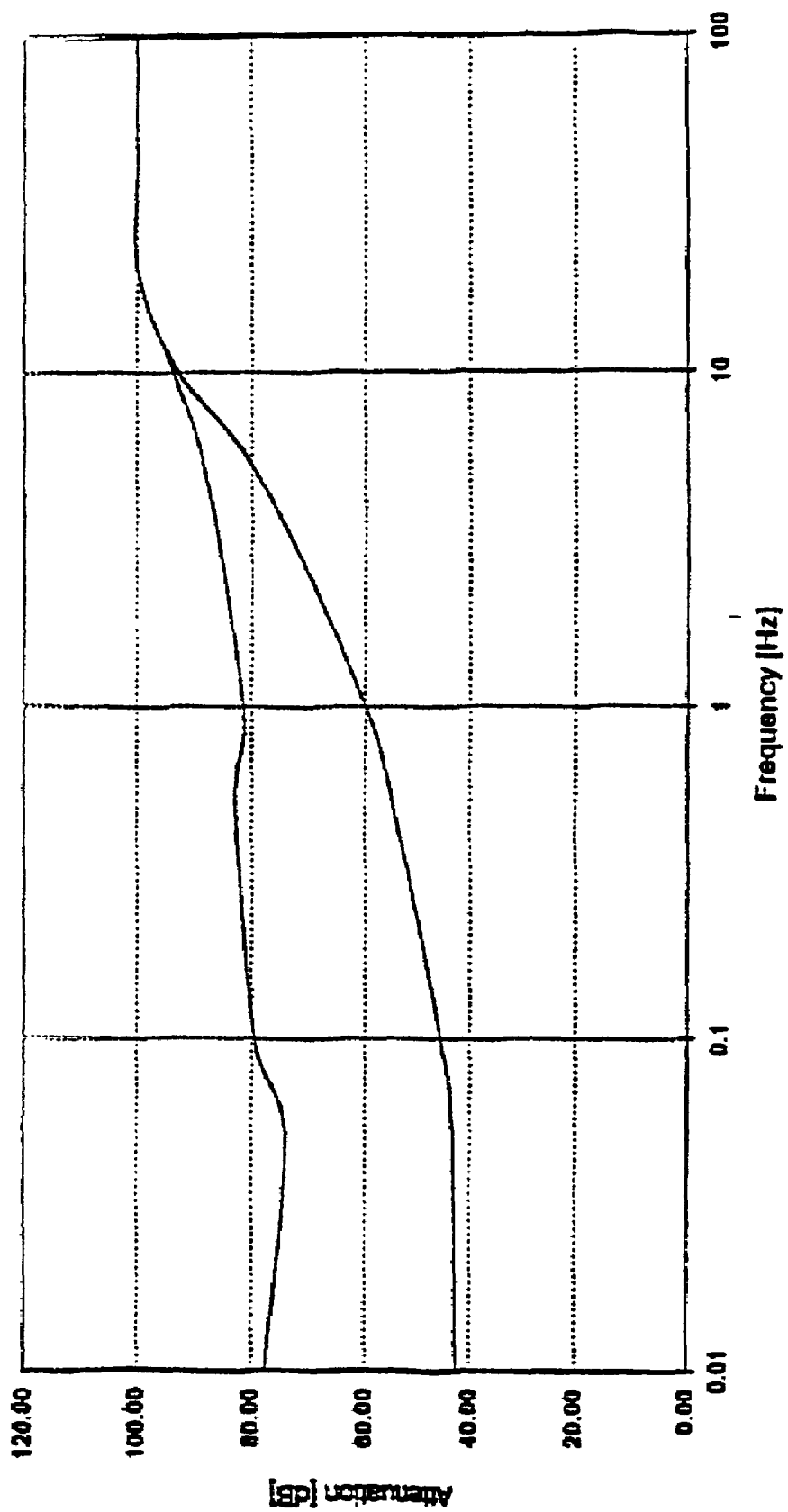
Figure 3:
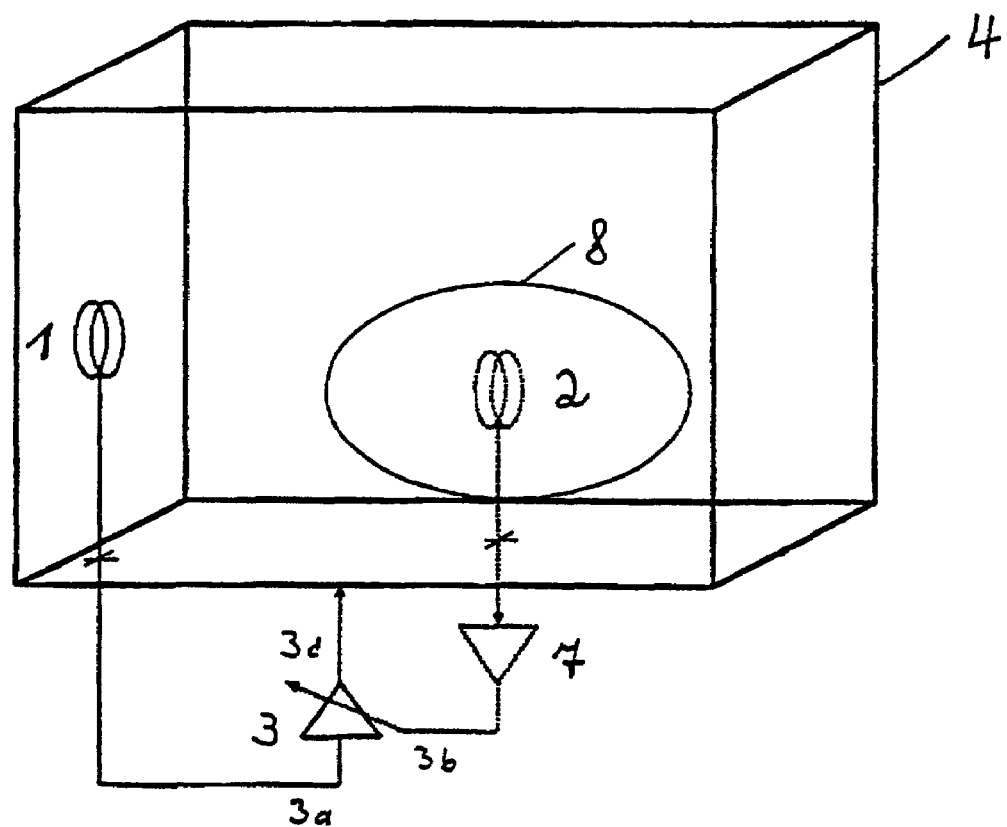

A number of embodiments of the invention are explained in more detail in the following text with reference to the attached drawings, in which:

FIG. 1 shows a schematic block diagram of One embodiment of the apparatus according to the invention for active compensation for magnetic and/or electromagnetic interference fields inside a predetermined volume in which a second sensor 1 is arranged outside the Helmholtz cage, and a first sensor 2 is arranged inside the predetermined volume in the Helmholtz cage;

FIG. 2 compares the profile of the attenuation of the magnetic interference field as a function of the frequency in the vertical direction in a magnetically shielded room with and without active compensation according to the invention for the embodiment illustrated in FIG. 1; and FIG. 3 shows a schematic block diagram of a further embodiment of the apparatus according to the invention, in which a second sensor 1 is arranged inside the Helmholtz cage, and a first sensor 2 is arranged inside the predetermined volume in the Helmholtz cage.

FIG. 1 shows a schematic block diagram of one embodiment of the apparatus according to the invention for active compensation for electromagnetic interference fields inside a predetermined volume. The apparatus comprises at least one Helmholtz coil, which essentially encloses the predetermined volume area. In this case, the predetermined volume area for the purposes of the invention comprises a volume within which the magnetic and/or electrical interference affects image-detection or imaging processes. The predetermined volume area in this case comprises at least the volume within which the said interference is intended to be compensated for. For partial compensation, defined volume areas may also be selected, such as imaging lenses and beam paths in electron microscopes or target areas in accelerators, beam paths and, optics in electron beam lithography systems, etc.

Furthermore, at least one second sensor 1 is arranged outside the Helmholtz coils in order to produce an electrical signal 1a which depends on the electromagnetic field at the location of the sensor 1, and at least one first sensor 2 is arranged inside the predetermined volume area in order to produce an electrical signal 2a which depends on the electromagnetic field at the location of the sensor 2. The signals from the first sensor (1a) and the second sensor (2a) act as input signals (3a, 3b) to actuate a regulator amplifier 3 which is associated with the Helmholtz coils. In particular, the electrical signal 1a is used as an input signal 3a to actuate the signal input of the digital regulator amplifier unit 3, and, after passing through the empirically determined transfer function $H_s$ (described by the filter 7 in FIG. 1), the electrical signal 2a is applied as the input signal 3b to the regulator input of the digital regulator amplifier unit 3. The output signal 3c from the digital regulator amplifier unit 3 controls the current through the Helmholtz coils. These Helmholtz coils can be arranged according to the invention such that they essentially compensate for the interference field in one or two spatial directions, but a Helmholtz cage 4 which encloses the predetermined volume area may also be designed in such a manner and actuated by the current from the digital amplifier unit 3 in such a manner that the current flow caused through the Helmholtz cage 4 in the predetermined volume area essentially compensates for the electromagnetic and/or magnetic interference field in all three spatial directions.

In this case, the sensors 1 and 2 detect the measurement variables in three spatial directions, or at least one sensor is provided for each spatial direction inside and outside the predetermined volume area, and the digital regulator amplifier unit 3 is set up to process multi-dimensional measurement variables and for current actuation of the Helmholtz cage.

In the present case of the embodiment illustrated in FIG. 1, the predetermined volume essentially comprises the interior of the Helmholtz cage, that is to say the second sensor is arranged outside the Helmholtz cage. The pre-processed electrical signal from the second sensor is thus amplified, according to the invention, outside the predetermined volume and is fed forward into the coils, while the electrical signal from the first sensor inside the predetermined volume is used for adaptive setting of the parameters for this forward feeding. In this case, relevant parameters such as the gain and phase angle are determined in a directionally dependent manner by means of an adaptive method, for example by minimizing the least mean square error of the interference signal, which depends on the magnetic and/or electromagnetic interference field. Other minimization methods are well known to the person skilled in the art and require no further explanation. The control parameters are changed, and the result of the measurement of the interference signal in the predetermined volume area is taken, according to the method, as the basis for resetting the parameters. The measured interference signal passes through the filter 7 with an empirically determined transfer function $H_s$, which corresponds to a mathematical convolution of the sensor-time signal with the impulse response $h_s$ of the system $H_s$. The regulator input of the digital regulator amplifier unit is now actuated by the convoluted signal, in order to set the regulator parameters. The optimum regulator parameters are those for which the magnetic and/or electromagnetic interference field in the predetermined volume area is minimized. $H_s$ corresponds to a model of the transmission path from the regulator output to the inner sensor 2, that is to say $H_s$ can naturally also be determined using a commercially available FFT analyzer. Subject to the transmission paths modeled in the filter 7 and the regulating amplifier being stable with time, the sensor 2 can be switched off and the determined transmission parameters for the regulator amplifier 3 can be retained. In another embodiment, the sensor 2 is not switched off, and the control parameters are continually matched to changing environmental conditions using the described adaptive method.

All magnetic field sensors, such as coils, flux-gate sensors, ESR sensors, NMR sensors, SQUID sensors and Hall-effect sensors, may be used as the second sensors 1 and first sensors 2, depending on the requirement. For example, an NMR sensor is used as the first sensor inside the predetermined volume in an NMR system. According to the invention, in one embodiment of the invention, different sensors are also used at the same time, for example a flux-gate sensor outside the predetermined volume and a SQUID sensor in the Helmholtz cage, or a plurality of different sensors outside and/or inside the cage in order that the compensation for the electromagnetic interference fields in the predetermined volume area is as dependent on position as possible.

In another embodiment, a further sensor 6 is arranged inside the predetermined volume area in order to detect a wanted signal, for example an NMR sensor or an ESR sensor in an NMR or ESR system, respectively. In a further embodiment, this sensor 6 is set up to detect the interference signal that depends on the magnetic and/or electromagnetic interference signal, and to detect the wanted signal that depends on the magnetic and/or electromagnetic wanted field. By way of example, the electromagnetic fields produced by human brain currents in a SQUID system or the electromagnetic field used to accelerate electrically charged parts in an accelerator device may be regarded as the wanted field. Wanted signals and interference signals can be separated, for example by virtue of the fact that the spectral behaviors of the signals generally differ.

In different embodiments, the apparatus can be used to shield a large number of systems, for example NMR systems, MRI systems, ESR systems, in electron beam systems and accelerator systems (for example linear accelerators).

Furthermore, the invention for active shielding has been coupled to the passive magnetic shielding method for a magnetically shielded room. In the implemented embodiment of the invention, the Helmholtz coils were fitted to the outside of the MSR. A flux-gate sensor was used as the sensor 1 and, inside the predetermined volume, that is to say inside the magnetically shielded room, a SQUID sensor was used as the sensor 6, to detect the wanted signal and the interference signal. The Helmholtz coils were actuated using a DC-2 kHz regulator amplifier.

FIG. 2 shows the result of such coupling of the active compensation according to the invention and the passive magnetic shielding in an MSR for an embodiment corresponding to FIG. 1. The figure shows the profile of the attenuation as a function of frequency in the vertical direction, with and without active compensation according to the invention for the electromagnetic interference fields. An increase in the attenuation of about 35 dB is achieved in the critical band between 0.1 and 0.2 Hz.

In a further embodiment, illustrated in FIG. 3, the apparatus according to the invention is used as a system with negative feedback for active compensation for electromagnetic and magnetic interference fields.

In this case, the predetermined volume in which the compensation essentially takes place comprises only one volume section 8 inside the Helmholtz cage 4, and the second sensor 1 is arranged inside the Helmholtz cage, but outside the predetermined volume area, in which the first sensor 2 is once again arranged.

The pre-processed electrical signal from the second sensor 1 is thus amplified according to the invention and is fed back to the coils with negative feedback, while the electrical signal from the first sensor 2 within the predetermined volume is used for adaptive setting of the parameters for this feedback. The setting of the parameters relevant for the feedback is carried out in an analogous manner as for the embodiment illustrated in FIG. 1 and discussed in detail above.

The optimal control parameters are also set here when the magnetic and/or electromagnetic interference field in the predetermined volume area is minimized. Subject to the transmission paths which are modeled in the filter 7 and in the regulating amplifier being stable with time, it is possible, depending on the embodiment, to switch off the sensor 2 and to retain the determined transmission parameters of the regulator amplifier 3. Once the sensor 2 and the filter 7 have been removed, the system operates with the conventional feedback arrangement. However, the regulator 3 now operates such that the feedback system minimizes the electromagnetic interference in the predetermined volume, in this case the volume area 8, and not, as conventionally, at the location of the sensor 1. The apparatus thus operates as a "quasi-feedforward" system.

Depending on the application, the embodiment illustrated in FIG. 3 is used in the same way as the embodiment illustrated in FIG. 1 with a large number of field sensors, such as coils, flux-gate sensors, ESR sensors, NMR sensors, SQUID sensors and Hall-effect sensors. The embodiment illustrated in FIG. 3 is used in a similar manner for shielding a large number of systems, for example NMR systems, MRI systems, ESR systems, in electron beam systems, accelerator systems (for example linear accelerators) and for magnetically shielded rooms (MSR).

The invention claimed is:

1. An apparatus for active compensation of magnetic and/or electromagnetic interference fields in a predetermined volume comprising at least one Helmholtz coil, which essentially encloses this volume, and a device for actuating the Helmholtz coil as a function of sensor signals,
   in which at least one first sensor (1) is arranged outside the predetermined volume in order to produce a signal (1a) which depends on the magnetic and/or electromagnetic field at the location of the sensor (1), and
   at least one second sensor (2) is arranged inside the predetermined volume, in order to produce a signal (2a) which depends on the magnetic and/or electromagnetic field at the location of the sensor (2), and the signals from the first sensor (1a) and from the second sensor (2a) are used as the input signals (3a, 3b) for actuating a regulator amplifier (3) associated with the Helmholtz coil.

2. The apparatus as claimed in claim 1, wherein once the signal from the second sensor (2a) has passed through an empirically determined transfer function $H_3$, it is applied to the regulator input (3b) of the digitally designed regulator amplifier (3a), and the output signal (3c) from the digital regulator amplifier (3) controls the current through the Helmholtz coil (4).

3. The apparatus as claimed in claim 1, wherein
   a large number of sensors (1, 2) detect magnetic and/or electromagnetic fields in all three spatial directions and their signals are used to actuate the digital regulator amplifier, and the output signals from the digital regulator amplifier are used to control the current through the coils of a three-axis Helmholtz cage, in such a manner that the magnetic and/or electromagnetic interference fields in all three spatial directions inside the predetermined volume are essentially compensated for.

4. The apparatus as claimed in claim 3, wherein
   the predetermined volume comprises the entire volume inside the Helmholtz cage, and the first sensor is thus arranged outside the Helmholtz cage.

5. The apparatus as claimed in claim 3, wherein
   the predetermined volume encloses a limited volume section (8) inside the Helmholtz cage, and the first sensor is arranged inside the Helmholtz cage.

6. The apparatus as claimed in claim 1, wherein
   at least one sensor (1, 2) of the first and/or of the second sensor is an ESR sensor, a NMR sensor, a MRI sensor, a flux-gate sensor, a coil, a SQUID sensor or a Hall-effect sensor.

7. The apparatus as claimed in claim 1, wherein
   at least one sensor (6) is arranged in the predetermined volume, in order to produce a wanted signal (6a).

8. The apparatus as claimed in claim 7, wherein
   at least one sensor (6) is surrounded in order to produce a wanted signal (6a) and the interference signal (2a).

9. The apparatus as claimed in claim 1, wherein the apparatus comprises a magnetically shielded room (MSR), in which case the Helmholtz coils (4) and at least one first sensor (1) are located outside the magnetically shielded room, and the predetermined volume and at least one second sensor (2) are located inside the magnetically shielded room.

10. The apparatus as claimed in claim 1, wherein the apparatus comprises a magnetically shielded room (MSR), in which case the Helmholtz coils (4) are arranged outside the magnetically shielded room, and the predetermined volume, the first sensor (1) and the second sensor (2) are located inside the magnetically shielded room.

11. The apparatus as claimed in claim 1, wherein the apparatus comprises an MRI system, in which case at least one first sensor (1) and one second sensor (2) as well as a wanted signal sensor for the MRI system are arranged inside the Helmholtz cage (4) formed by the Helmholtz coils.

12. The use of an apparatus as claimed in claim 1 for active compensation for electromagnetic interference fields in a SQUID system.

13. The use of an apparatus as claimed in claim 1 for active compensation for electromagnetic interference fields in an MRI (Magnetic Resonance Imaging) system.

14. The use of an apparatus as claimed in claim 1 for active compensation for electromagnetic interference fields in an ESR (Electron Spin Resonance) system.

15. The use of an apparatus as claimed in claim 1 for active compensation for electromagnetic interference fields in an NMR (Nuclear Magnetic Resonance) system.

16. The use of an apparatus as claimed in claim 1 for active compensation for electromagnetic interference fields in an electron beam system.

17. The use of an apparatus as claimed in claim 1 for active compensation for electromagnetic interference fields in an accelerator system.

18. A method for active compensation for magnetic and/or electromagnetic interference fields in a predetermined volume by means of at least one Helmholtz coil, which essentially encloses this volume, and a device for actuating the Helmholtz coil as a function of sensor signals,
   comprising the steps of arranging at least one first sensor (2) inside the predetermined volume in order to produce a signal (2a) which depends on the magnetic and/or electromagnetic field at the location of the first sensor (2), using the signal from the first sensor as an input signal (3b) in order to actuate a regulator amplifier (3) associated with the Helmholtz coil,
   arranging at least one second sensor (1) outside the predetermined volume in order to produce a signal (1a) which depends on the magnetic and/or electromagnetic field at the location of the sensor (1), and
   using the signal from the second sensor (1a) as an input signal (3a) in order to actuate the regulator amplifier (3) associated with the Helmholtz coil, and wherein, once the signal from the second sensor (2a) has passed through an empirically determined transfer function $H_3$, it is applied to the regulator input (3b) of the digitally designed regulator amplifier (3a), and the output signal (3c) from the digital regulator amplifier (3) controls the current through the Helmholtz coils (4), in such a manner that the electromagnetic and magnetic interference field in the predetermined volume is at least partially compensated for.

19. The method as claimed in claim 18, wherein once the control parameters for the digital regulator amplifier 3 have been set, these control parameters are retained, and the apparatus is operated without the second sensor 2 and the filter 7.

* * * * *